(12) United States Patent
Kim et al.

(10) Patent No.: US 9,634,238 B2
(45) Date of Patent: Apr. 25, 2017

(54) MAGNETIC STRUCTURES, METHODS OF FORMING THE SAME AND MEMORY DEVICES INCLUDING A MAGNETIC STRUCTURE

(71) Applicant: Samsung Electronics Co., Ltd., Suwon-si, Gyeonggi-do (KR)

(72) Inventors: Kwang-seok Kim, Seoul (KR); Sung-chul Lee, Osan-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/710,107

(22) Filed: May 12, 2015

(65) Prior Publication Data

US 2015/0357558 A1    Dec. 10, 2015

Related U.S. Application Data

(62) Division of application No. 13/549,901, filed on Jul. 16, 2012, now abandoned.

(30) Foreign Application Priority Data

Jan. 6, 2012    (KR) .................. 10-2012-0002041

(51) Int. Cl.
*H01L 43/02*    (2006.01)
*H01L 43/08*    (2006.01)
(Continued)

(52) U.S. Cl.
CPC .............. *H01L 43/02* (2013.01); *B82Y 40/00* (2013.01); *G11C 11/161* (2013.01); *H01F 10/30* (2013.01); *H01F 10/3254* (2013.01); *H01F 41/302* (2013.01); *H01L 27/228* (2013.01); *H01L 43/08* (2013.01); *H01L 43/12* (2013.01); *H01F 10/3286* (2013.01)

(58) Field of Classification Search
CPC ....... H01L 43/02; H01L 43/08; H01L 27/228; H01L 43/12; H01F 10/30; H01F 41/302; H01F 10/3254; H01F 10/3286; G11C 11/161

See application file for complete search history.

(56) References Cited

U.S. PATENT DOCUMENTS 8,502,331 B2    8/2013    Kitagawa et al.
8,786,036 B2    7/2014    Cao et al.
(Continued)

FOREIGN PATENT DOCUMENTS

JP    2010-080733 A    4/2010
KR    10-2011-0019142 A    2/2011
(Continued)

*Primary Examiner* — David Vu
(74) *Attorney, Agent, or Firm* — Harness, Dickey & Pierce, PLC

(57) ABSTRACT

Magnetic structures, methods of forming the same, and memory devices including a magnetic structure, include a magnetic layer, and a stress-inducing layer on a first surface of the magnetic layer, a non-magnetic layer on a second surface of the magnetic layer. The stress-inducing layer is configured to induce a compressive stress in the magnetic layer. The magnetic layer has a lattice structure compressively strained due to the stress-inducing layer.

19 Claims, 21 Drawing Sheets

(51) Int. Cl.
    *H01L 43/12*     (2006.01)
    *H01L 27/22*     (2006.01)
    *G11C 11/16*     (2006.01)
    *H01F 10/30*     (2006.01)
    *H01F 10/32*     (2006.01)
    *H01F 41/30*     (2006.01)
    *B82Y 40/00*     (2011.01)

(56) References Cited

U.S. PATENT DOCUMENTS

| | | |
|---|---|---|
| 2003/0184921 A1 | 10/2003 | Sugita et al. |
| 2008/0217710 A1 | 9/2008 | Horng et al. |
| 2009/0251951 A1 * | 10/2009 | Yoshikawa ............ B82Y 10/00 365/158 |
| 2010/0244163 A1 | 9/2010 | Daibou et al. |
| 2011/0222335 A1 | 9/2011 | Yoshikawa et al. |
| 2011/0254114 A1 | 10/2011 | Nagamine et al. |
| 2012/0075922 A1 * | 3/2012 | Yamada ................ B82Y 25/00 365/158 |
| 2013/0154036 A1 | 6/2013 | Tang et al. |

FOREIGN PATENT DOCUMENTS

| | | |
|---|---|---|
| KR | 10-2011-0083403 A | 7/2011 |
| KR | 2011-0079827 | 7/2011 |
| WO | WO-2010/039422 A1 | 4/2010 |

* cited by examiner

< HEATING >

< COOLING >

< HEATING >

< COOLING >

< PHASE TRANSFORMATION >

< PHASE TRANSFORMATION >

● : Al
○ : Mn

● : Al
○ : Mn

MAGNETIC STRUCTURES, METHODS OF FORMING THE SAME AND MEMORY DEVICES INCLUDING A MAGNETIC STRUCTURE

CROSS-REFERENCE TO RELATED APPLICATION

This application is a divisional application of U.S. application Ser. No. 13/549,901 filed Jul. 16, 2012, which claims the benefit of priority under 35 U.S.C. §119 to Korean Patent Application No. 10-2012-0002041, filed on Jan. 6, 2012, in the Korean Intellectual Property Office, the disclosure of each which is incorporated herein by reference in their entirety.

BACKGROUND

1. Field

Example embodiments relate to magnetic structures, methods of forming the same, and memory devices including a magnetic structure.

2. Description of the Related Art

Magnetic random access memories (MRAMs) are memory devices that store data by using a variation in a resistance of a magnetic tunneling junction (MTJ) element of a memory cell. The resistance of the MTJ element varies according to a magnetization direction of a free layer. That is, when the magnetization direction of the free layer is the same as a magnetization direction of a pinned layer, the MTJ element has low resistance. When the magnetization direction of the free layer is opposite to the magnetization direction of the pinned layer, the MTJ element has high resistance. A case where the MTJ element has the low resistance may correspond to data '0', and a case where the MTJ element has the high resistance may correspond to data '1'. Because such a MRAM is non-volatile is capable of high speed operations and has high endurance, the MRAM has gained attention as one of the next generation non-volatile memory devices.

In order to increase a recording density of MRAM (i.e., to obtain a high density MRAM), a size of the MTJ element has to be reduced. However, when the size of the MTJ element is reduced, thermal stability of data recorded in a data storage layer (i.e., free layer) decreases. Thus, securing a data retention characteristic becomes difficult. In this regard, it is not easy to increase the recording density of the MRAM over a certain level.

SUMMARY

Example embodiments relate to magnetic structures, methods of forming the same, and memory devices including a magnetic structure.

Provided are magnetic structures suitable for scaling down magnetoresistive elements.

Provided are magnetic structures capable of increasing magnetic anisotropy energy of a magnetic layer.

Provided are magnetic structures capable of increasing thermal stability of a magnetic layer.

Provided are magnetic structures capable of increasing a critical thickness for maintaining perpendicular magnetic anisotropy of a magnetic layer.

Provided are magnetic structures capable of increasing a magnetoresistance ratio (i.e., a MR ratio).

Provided are magnetic structures suitable for realizing high density and high performance of a memory device.

Provided are methods of forming a magnetic structure.

Provided are memory devices including the magnetic structures.

Additional aspects will be set forth in part in the description which follows and, in part, will be apparent from the description, or may be learned by practice of the presented embodiments.

According to example embodiments, a magnetic structure may include a magnetic layer, a stress-inducing layer on a first surface of the magnetic layer, and a non-magnetic layer on a second surface of the magnetic layer, wherein the stress-inducing layer is configured to induce a compressive stress in the magnetic layer, and the magnetic layer has a lattice structure compressively strained due to the stress-inducing layer.

The magnetic layer may have interface perpendicular magnetic anisotropy (IPMA) due to an interface between the magnetic layer and the non-magnetic layer.

The magnetic layer may include a Fe-based material or a CoFe-based material. The CoFe-based material may include CoFeB.

The non-magnetic layer may include an insulating material'. The non-magnetic layer may include an oxide. The oxide may include a magnesium (Mg) oxide, for example.

The stress-inducing layer may include a material with a thermal expansion coefficient higher than a thermal expansion coefficient of the magnetic layer.

The stress-inducing layer may include at least one of Al, Ga, Mn, Zn, Cu, and combinations thereof, for example.

The stress-inducing layer may include a phase transformation material.

The stress-inducing layer may include a material with a lattice parameter smaller than a lattice parameter of the magnetic layer.

The magnetic layer may be between the stress-inducing layer and the non-magnetic layer.

The magnetic layer may include a first layer in contact with the non-magnetic layer, and a second layer between the first layer and the stress-inducing layer.

A saturation magnetization (Ms) of the second layer may be smaller than a saturation magnetization of the first layer.

When the magnetic layer includes the first layer and the second layer, the magnetic layer may have a thickness of about 1 nm to about 3 nm.

The first layer may have a thickness of about 1 nm or less.

The second layer may have a thickness of about 2 nm or less.

The magnetic layer may be a first magnetic layer. The magnetic structure may include a second magnetic layer on a surface of the non-magnetic layer. The non-magnetic layer may be disposed between the first magnetic layer and the second magnetic layer.

One of the first and second magnetic layers may be a free layer, and the other may be a pinned layer.

The magnetic structure may be a magnetoresistive element.

According to example embodiments, a method of forming a magnetic structure may include forming a magnetic layer having a lattice structure compressively strained due to a stress-inducing layer, and forming a non-magnetic layer contacting the magnetic layer.

The magnetic layer may have interface perpendicular magnetic anisotropy (IPMA) due to an interface between the magnetic layer and the non-magnetic layer.

The stress-inducing layer may be formed of a material with a thermal expansion coefficient higher than a thermal expansion coefficient of the magnetic layer.

When the stress-inducing layer is formed the material with the thermal expansion coefficient higher than the thermal expansion coefficient of the magnetic layer, forming the magnetic layer may include heating the stress-inducing layer, forming a magnetic material layer on the heated stress-inducing layer, and cooling the magnetic material layer and the stress-inducing layer such that the lattice structure of the magnetic material layer is compressively strained.

When the stress-inducing layer is formed the material with the thermal expansion coefficient higher than the thermal expansion coefficient of the magnetic layer, forming the magnetic layer may include heating the magnetic material layer, forming the stress-inducing layer on the heated magnetic material layer, and cooling the stress-inducing layer and the magnetic material layer such that the lattice structure of the magnetic material layer is compressively strained.

The stress-inducing layer may be formed of a phase transformation material.

When the stress-inducing layer is formed of a phase transformation material, forming the magnetic layer may include forming the stress-inducing layer and a magnetic material layer in contact with the stress-inducing layer; and changing a phase of the stress-inducing layer such that the lattice structure of the magnetic material layer may be compressively strained.

The stress-inducing layer may be formed of a material with a lattice parameter smaller than a lattice parameter of the magnetic layer.

The magnetic layer may be formed including a first layer in contact with the non-magnetic layer, and a second layer disposed between the first layer and the stress-inducing layer, wherein a saturation magnetization (Ms) of the second layer may be smaller than a saturation magnetization of the first layer.

The magnetic layer may be a first magnetic layer. The method may further include forming a second magnetic layer on a surface of the non-magnetic layer, and the non-magnetic layer may be disposed between the first and second magnetic layer.

One of the first and second magnetic layers may be a free layer, and the other may be a pinned layer.

According to example embodiments, a memory device includes at least one memory cell including a magnetoresistive element, wherein the magnetoresistive element includes first and second magnetic layers spaced apart from each other, a non-magnetic layer between the first and second magnetic layers, and a stress-inducing layer configured to induce a compressive stress in the first magnetic layer, wherein the first magnetic layer has a lattice structure compressively strained due to the stress-inducing layer.

The memory cell may further include a switching element connected to the magnetoresistive element.

The first magnetic layer may be a free layer, and the second magnetic layer may be a pinned layer.

The first magnetic layer may have interface perpendicular magnetic anisotropy (IPMA) due to at an interface between the first magnetic layer and the non-magnetic layer.

The stress-inducing layer may include a material with a thermal expansion coefficient higher than a thermal expansion coefficient of the first magnetic layer.

The stress-inducing layer may include a phase transformation material.

The stress-inducing layer may include a material with a lattice parameter smaller than a lattice parameter of the first magnetic layer.

The first magnetic layer may include a first layer in contact with the non-magnetic layer, and a second layer disposed between the first layer and the stress-inducing layer, wherein a saturation magnetization (Ms) of the second layer may be smaller than a saturation magnetization of the first layer.

The memory device may be a magnetic random access memory (MRAM).

The memory device may be a spin transfer torque magnetic random access memory (STT-MRAM).

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
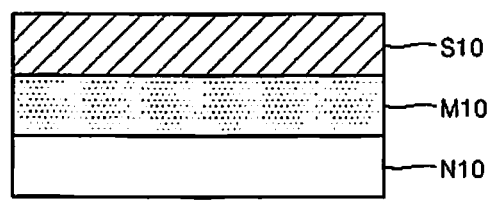
FIGS. 1 through 4 are cross-sectional views of magnetic structures according to example embodiments.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to (an) other element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations in the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Expressions such as "at least one of," when preceding a list of elements, modify the entire list of elements and do not modify the individual elements of the list.

In the drawings, the thicknesses of layers and regions are exaggerated for clarity. Like reference numerals in the drawings denote like elements.

Example embodiments relate to magnetic structures, methods of forming the same, and memory devices including a magnetic structure.

FIG. 1 is a cross-sectional view of a magnetic structure according to example embodiments.

Referring to FIG. 1, a non-magnetic layer N10 may be formed on a surface (e.g., a lower surface) of a magnetic layer M10. A stress-inducing layer S10 may be formed on another surface (e.g., an upper surface) of the magnetic layer M10. The magnetic layer M10 may have an interface perpendicular magnetic anisotropy (IPMA) property due to an interface (i.e., a contact surface) between the magnetic layer M10 and the non-magnetic layer N10. That is, the magnetic layer M10 and the non-magnetic layer N10 may constitute an IPMA system or an IPMA structure. The magnetic layer M10 may include a Fe-based material or a CoFe-based material. Here, the Co—Fe-based material may include, for example, CoFeB. The non-magnetic layer N10 may be an insulating layer. In this case, the non-magnetic layer N10 may include an oxide. The oxide may include, for example, a magnesium oxide (i.e., MgO). Although CoFeB, which is mentioned for a material of the magnetic layer M10, normally (intrinsically) have an in-plane magnetic anisotropy (IMA) property, when CoFeB is in contact with a given oxide (e.g., MgO), CoFeB may have a perpendicular magnetic anisotropy (PMA) property due to an interfacial effect. A thickness of the magnetic layer M10 may be equal to or less than about 2 nm, and a thickness of the non-magnetic layer N10 may be equal to or less than about 3 nm. However, the thicknesses of the magnetic layer M10 and the non-magnetic layer N10 are not limited thereto and may vary.

The stress-inducing layer S10 may be a layer inducing a compressive stress in the magnetic layer M10. In other words, the stress-inducing layer S10 may apply a compressive stress to the magnetic layer M10. The compressive stress is a compressive stress in the in-plane direction. The magnetic layer M10 may have a lattice structure that is compressively strained due to the stress-inducing layer S10. That the magnetic layer M10 is compressively strained means that the magnetic layer M10 has a lattice parameter smaller than that of an equilibrium state (i.e., unstrained state) thereof. Because the magnetic layer M10 is thin, the lattice structure of all region of the magnetic layer M10 may be compressively strained. That is, as well as a region of the magnetic layer M10 which is in contact with the stress-inducing layer S10, the opposite region (i.e., a region of the magnetic layer M10 which is in contact with the non-magnetic layer N10) may also be compressively strained. When the magnetic layer M10 has a compressively strained structure, magnetic anisotropy energy of the magnetic layer M10 may increase. In other words, the magnetic layer M10 may have a higher magnetic anisotropy energy when the magnetic layer M10 is compressively strained than when the magnetic layer M10 is not compressively strained (e.g., when the magnetic layer M10 is in an equilibrium state). When the magnetic layer M10 has IPMA due to the interface with the non-magnetic layer N10, the magnetic anisotropy energy of the magnetic layer M10 may be referred to as "a surface magnetic anisotropy energy ($K_S$)." Therefore, the surface magnetic anisotropy energy $K_S$ of the magnetic layer M10 may increase due to the stress-inducing layer S10. As the magnetic anisotropy energy of the magnetic layer M10 increases, thermal stability of magnetization of the magnetic layer M10 may be increased, which will be described later in detail.

The stress-inducing layer S10 may include a material with a thermal expansion coefficient greater than that of the magnetic layer M10. The material with a thermal expansion coefficient greater than that of the magnetic layer M10 may be, for example, Al, Ga, Mn, Zn, Cu or combinations thereof. A thermal expansion coefficient of Al is about double that of Fe, and a thermal expansion coefficient of Ga is about ten times greater than that of Fe. Although a layer, for example an Al layer, including the material with a thermal expansion coefficient greater than that of the magnetic layer M10 is in contact with the magnetic layer M10, the Al layer may not induce stress in the magnetic layer M10 if the Al layer is not formed under certain conditions. If the Al layer is formed under the certain conditions, the Al layer may be a layer inducing stress in the magnetic layer M10, that is, may be the stress-inducing layer S10. Therefore, not just any layer formed of Al, Ga, Mn, Zn, Cu or combinations thereof may correspond to the stress-inducing layer S10. A method of forming the stress-inducing layer S10 using the material with thermal expansion coefficient greater than that of the magnetic layer M10 will be described later in detail.

According to example embodiments, the stress-inducing layer S10 may include a phase transformation material. The phase transformation material may be a material that has a first phase at low temperature and has a second phase at high temperature. A lattice parameter of the second phase in the in-plane direction may be smaller than that of the first phase. Thus, as a crystalline structure of the phase transformation material transforms from the first phase to the second phase, a compressive stress may be induced in the magnetic layer M10. The phase transformation material may be a material which transforms to the second phase at high temperature and continuously maintains the second phase even when the temperature is decreased to low temperature. That is, the phase transformation material may be a material that transforms its phase irreversibly. For example, the phase transformation material may include MnAl. A method of forming the stress-inducing layer S10 using the phase transformation material will be described later in detail. According to example embodiments, the stress-inducing layer S10 may include a material with a lattice parameter smaller than that of the magnetic layer M10. The lattice parameter of the stress-inducing layer S10 in the in-plane direction may be smaller than that of the magnetic layer M10. A difference between the lattice parameter of the stress-inducing layer S10 and the lattice parameter of the magnetic layer M10 may be within about 10%. If the material with the lattice parameter smaller than that of the magnetic layer M10 is in contact with the magnetic layer M10, compressive stress may be induced in the magnetic layer M10. Meanwhile, although a thickness of the stress-inducing layer S10 is not particularly limited, the thickness may be less than or equal to about 20 nm.

As mentioned above, as the magnetic layer M10 is compressively strained, the magnetic anisotropy energy of the magnetic layer M10 may be increased. The reason for this will be described with reference to FIGS. 18A, 18B, 19A and 19B.

Figure 18A:
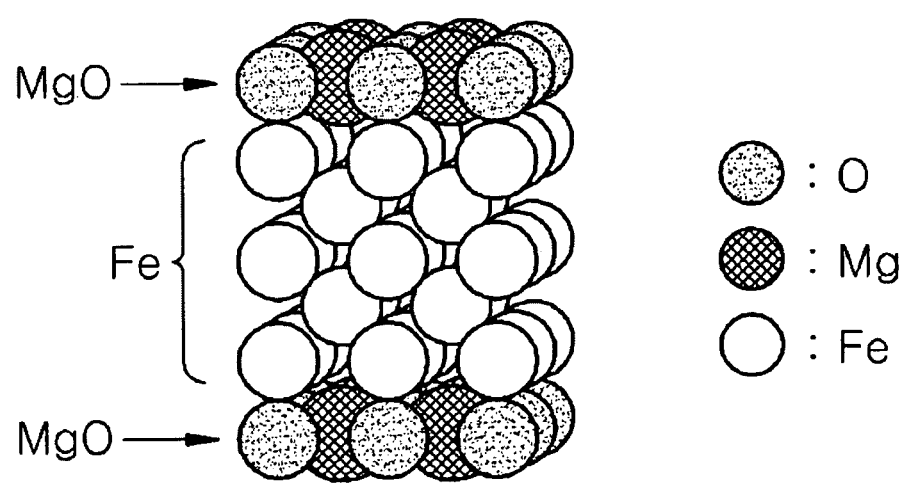
FIG. 18A is a drawing showing a crystalline structure of MgO/Fe.
Figure 18B:
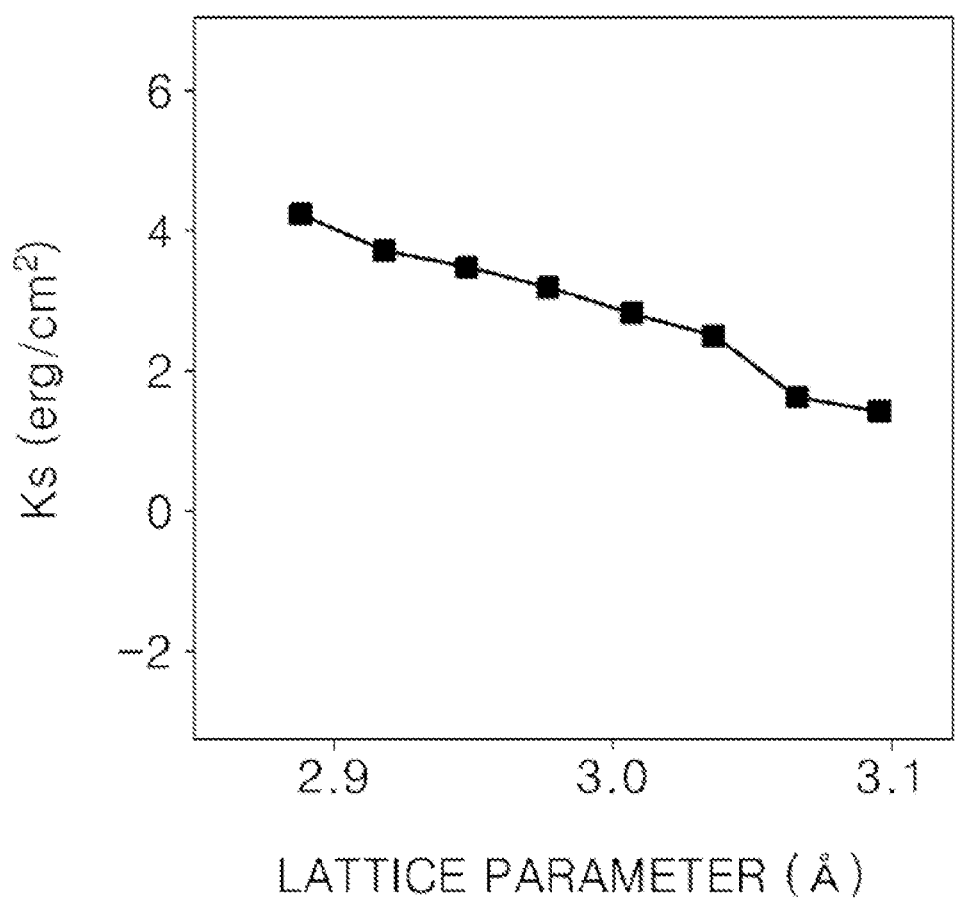
FIG. 18B is a graph showing a change in a surface magnetic anisotropy energy ($K_S$) according to a lattice parameter of Fe in a structure of MgO/Fe.
Figure 19A:
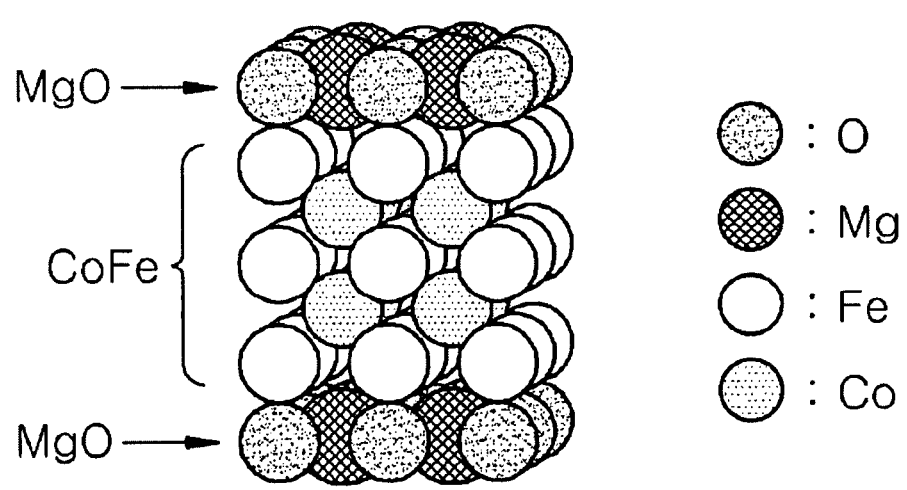
FIG. 19A is a drawing showing a crystalline structure of MgO/CoFe.
Figure 19B:
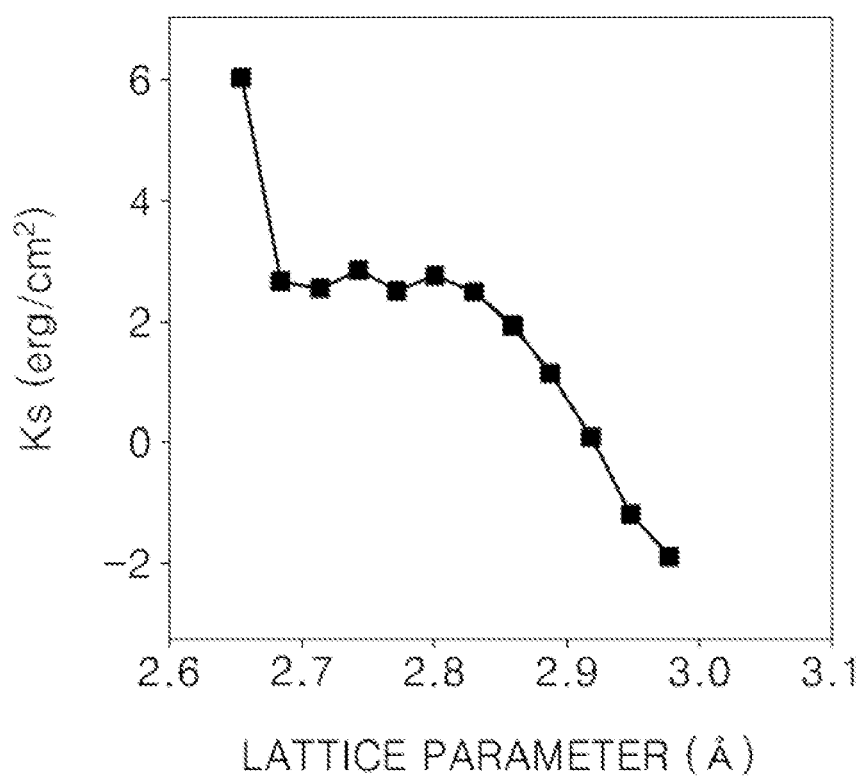
FIG. 19B is a graph showing a change in a surface magnetic anisotropy energy ($K_S$) of a lattice parameter of CoFe in a structure of MgO/CoFe.

FIG. 18A shows a crystalline structure of MgO/Fe, and FIG. 18B shows a change in the surface magnetic anisotropy energy ($K_S$) according to the lattice parameter of Fe in the structure of MgO/Fe. FIG. 19A shows a crystalline structure of MgO/CoFe, and FIG. 19B shows a change in the surface magnetic anisotropy energy ($K_S$) according to the lattice parameter of CoFe in the structure of MgO/CoFe. Here, the lattice parameter is a lattice parameter between Fe atoms (i.e., Fe—Fe) in the in-plane direction, and the surface magnetic anisotropy energy ($K_S$) is an intrinsic surface perpendicular magnetic anisotropy energy (intrinsic $K_S$). Meanwhile, CoFe of FIGS. 19A and 19B is $Co_{0.4}Fe_{0.6}$.

Referring to FIGS. 18A, 18B, 19A and 19A, as the lattice parameters of Fe and CoFe becoming smaller than that of the equilibrium state (2.95 Å), the surface magnetic anisotropy energy ($K_S$) has a tendency to be increased. This indicates that in a case where a magnetic layer is Fe or CoFe based, when the magnetic layer has a lattice parameter smaller than that of an equilibrium state (i.e., when the magnetic layer has a lattice structure that is compressively strained), the surface magnetic anisotropy energy ($K_S$) increases. Particularly, when the lattice parameter of CoFe in FIG. 19 is about 2.65 Å, the surface magnetic anisotropy energy ($K_S$) shows a very high value of about 6 erg/cm$^2$.

For the same reason explained with reference to FIGS. 18A, 18B, 19A and 19B, when the magnetic layer M10 of FIG. 1 has a compressively strained crystalline structure, its magnetic anisotropy energy or surface magnetic anisotropy energy may be increased. In this regard, the thermal stability of magnetization of the magnetic layer M10 may be improved. The thermal stability of a magnetic layer (e.g., M10 of FIG. 1) in the IPMA structure is proportional to a ratio of the magnetic anisotropy energy and a thermal energy (i.e., $K_S A/k_B T$). Here, '$K_S$' represents the surface magnetic anisotropy energy (erg/cm$^2$) of the magnetic layer, 'A' represents a surface area of the magnetic layer (a contact surface area in contact with a non-magnetic layer), '$k_B$' represents a Boltzmann constant, and 'T' represents absolute temperature. Depending on how large the magnetic anisotropy energy ($K_S A$) is in comparison with the thermal energy (kJ), the thermal stability of the magnetic layer may be determined. Therefore, as the surface magnetic anisotropy energy ($K_S$) increases, the thermal stability may be improved. According to example embodiments, as the magnetic anisotropy energy ($K_S$) increases due to the stress-inducing layer S10, the thermal stability of the magnetic layer M10 may be easily secured. This means that it is easy to reduce the size of the magnetic layer M10. In other words, scaling down of the magnetic layer M10 is possible without adverse effects. If the surface magnetic anisotropy energy ($K_S$) of the magnetic layer M10 is high, a value of the magnetic anisotropy energy ($K_S A$) may be maintained high even when a size (width) of the magnetic layer M10 is reduced. According to example embodiments, scaling down to 20 nm or less may be possible, and thus ultra high density devices may be manufactured.

The structure of FIG. 1 is merely exemplary, and the structure may be changed in various ways. For example, although FIG. 1 illustrates a case where the magnetic layer M10 and the stress-inducing layer S10 are sequentially stacked on the non-magnetic layer N10, their relation in terms of location may be changed. A changed example is illustrated in FIG. 2.

Figure 2:
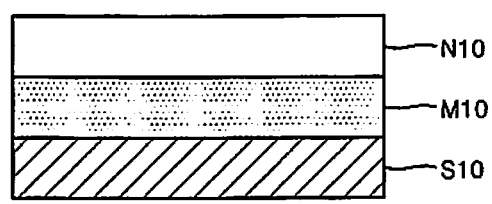

Referring to FIG. 2, the stress-inducing layer S10 may be formed on the lower surface of the magnetic layer M10, and the non-magnetic layer N10 may be formed on the upper layer of the magnetic layer M10. That is, the magnetic layer M10 and the non-magnetic layer N10 may be sequentially stacked on the stress-inducing layer S10. Materials, properties, thicknesses, etc. of the magnetic layer M10, the stress-inducing layer S10, and the non-magnetic layer N10 may be the same as those described with reference to FIG. 1.

Figure 3:
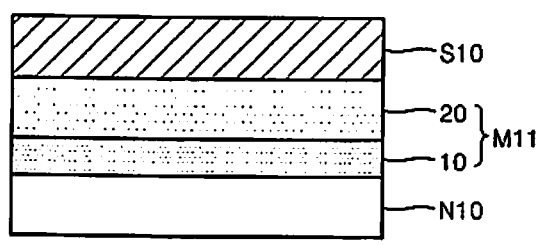

FIG. 3 is a cross-sectional view of a magnetic structure according to example embodiments.

Referring to FIG. 3, a magnetic layer M11 may have a multi-layer structure. For example, the magnetic layer M11 may have a double-layer structure including a first layer 10 and a second layer 20. The first layer 10 may be formed of the same material as the magnetic layer M10 of FIG. 1. That is, the first layer 10 may include a material that is Fe-based or CoFe-based. Here, the CoFe-based material may include, for example, CoFeB. The first layer 10 may have IPMA at an interface with a non-magnetic layer N10. Due to the first layer 10, all of the magnetic layer M11 may have perpendicular magnetic anisotropy (PMA). That is, the magnetic isotropy of the magnetic layer M11 may be determined by the first layer 10. The second layer 20 may be formed of a material with saturation magnetization (Ms) smaller than that of the first layer 10. For example, the second layer 20 may have a composition in which a non-magnetic material is added to a given magnetic material. The non-magnetic material may serve to reduce the saturation magnetization (Ms) of the second layer 20. The magnetic material of the second layer 20 may include at least one of Co, Fe, and Ni, and the non-magnetic material may include, for example, V, Al, Cr, Ti, Ta or combinations thereof. A thickness of the first layer 10 may be, for example, about 1 nm or less, and a thickness of the second layer 20 may be, for example, about 2 nm or less. An entire thickness of the magnetic layer M11 may be about 3 nm or less, for example about 1 to 3 nm. As such, if the magnetic layer M11 is constructed in the multi-layer structure, a critical thickness of the magnetic layer M11, of which PMA or IPMA is maintained, may be increased. The following is a detailed explanation.

When the thickness of the magnetic layer M10 is excessively thickened, IPMA of the magnetic layer M10 may not be maintained because if the magnetic layer M10 has a large thickness, demagnetization energy becomes greater than the perpendicular magnetic anisotropy energy due to an interfacial effect between the magnetic layer M10 and the non-magnetic layer N10. Therefore, when the thickness of the magnetic layer M10 is large, magnetic anisotropy may change from perpendicular to in-plane. The following Equation 1 shows a relationship between an intrinsic surface perpendicular magnetic anisotropy energy (intrinsic $K_S$) and an effective surface perpendicular magnetic anisotropy energy (effective $K_S$).

$$\text{Effective } K_S = \text{Intrinsic } K_S - 2\pi \cdot Ms^2 \cdot t \qquad \text{Equation 1}$$

In Equation 1, $2\pi \cdot Ms^2 \cdot t$ represents a demagnetization energy. As the thickness (t) of the magnetic layer M10 is increased in FIG. 1, the demagnetization energy increases and the effective surface perpendicular magnetic anisotropy energy (effective $K_S$) decreases. Therefore, when the thickness (t) reaches a certain level or higher, the magnetic anisotropy of the magnetic layer M10 may change from perpendicular to in-plane. In this regard, it may be difficult to increase the thickness (t) of the magnetic layer M10 in the structure of FIG. 1.

Figure 7:
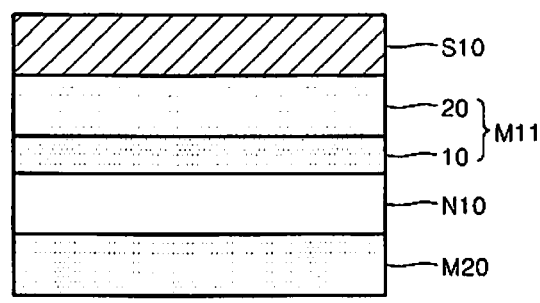
Figure 8:
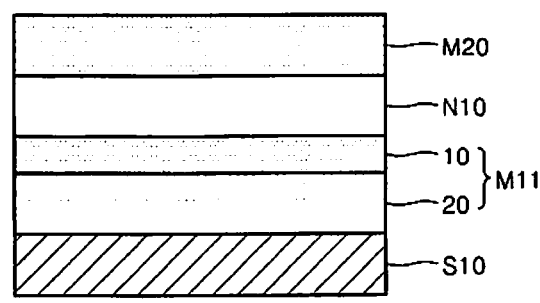

However, as in the example embodiments of FIG. 3, when the second layer 20 having a low saturation magnetization Ms is used, saturation magnetization Ms of the entire magnetic layer M11 may be lowered, and thus the demagnetization energy may be lowered. Thus, a critical thickness of the magnetic layer M11, of which IPMA is maintained, may be increased. Therefore, the thickness of the magnetic layer M11 may be increased to 1 nm or more. For example, the thickness of the magnetic layer M11 may be about 1 to 3 nm, or about 1.5 to 3 nm. When a magnetoresistive element is formed using the magnetic structure of FIG. 3 (e.g., when a magnetoresistive element as shown in FIG. 7 is formed), as the thickness of the magnetic layer M11 increases, a magnetoresistance ratio (i.e., a MR ratio) of the magnetoresistive element may be increased. For example, the magnetoresistance ratio (i.e., the MR ratio) of the magnetoresistive element may be increased to about 200%. Thus, if the magnetic structure according to example embodiments is used, a magnetoresistive element having excellent performance may be obtained. If such a magnetoresistive element is used in a memory device, an operation margin of the memory device may be widened.

A structure of the upside-down flipped structure of FIG. 3 is possible. The example is shown in FIG. 4.

Figure 4:
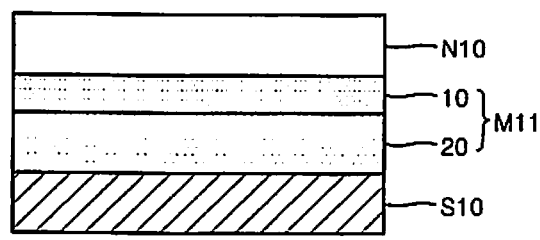
Figure 5:
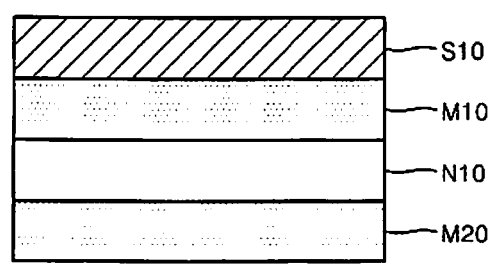
FIGS. 5 through 8 are cross-sectional views of magnetoresistive elements including magnetic structures according to example embodiments.
Figure 6:
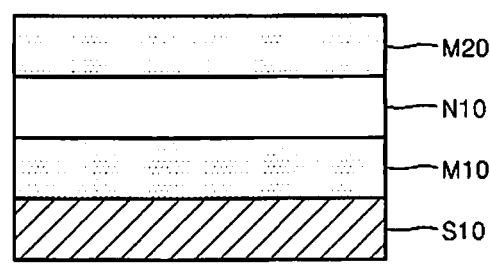

In FIG. 4, the magnetic layer M11 and the non-magnetic layer N10 are sequentially formed on the stress-inducing layer S10, and the magnetic layer M11 includes the first layer 10 and the second layer 20. The second layer 20 is formed between the first layer 10 and the stress-inducing layer S10.

The magnetic structures of FIGS. 1 through 4 may further include a second magnetic layer.

FIGS. 5 through 8 illustrate the cases in which the second magnetic layer is added to the magnetic structures of FIGS. 1 through 4.

Referring to FIGS. 5 through 8, the magnetic layers M10 and M11 may be first magnetic layers M10 and M11, and the second magnetic layer M20 may be further formed on a surface of the non-magnetic layer N10. The second magnetic layer M20 may be formed facing the first magnetic layer M10 or M11 with the non-magnetic layer N10 therebetween. Thus, the non-magnetic layer N10 may be formed between the first magnetic layer M10 or M11 and the second magnetic layer M20. The second magnetic layer M20 may be formed of a ferromagnetic material including at least one of, for example, Co, Fe, Ni and combinations thereof. The ferromagnetic material may further include an element other than Co, Fe, Ni and combinations thereof, for example, B, Cr, Pt, Pd or combinations thereof. When the first magnetic layer M10 or M11 exhibits perpendicular magnetic anisotropy, the second magnetic layer M20 may also exhibit perpendicular magnetic anisotropy. However, a material of the second magnetic layer M20 is not limited thereto and may vary. Meanwhile, a thickness of the second magnetic layer M20 may be less than or equal to about 50 nm, for example, less than or equal to about 30.

One of the first magnetic layer M10 or M11 and the second magnetic layer M20, for example, the first magnetic layer M10 or M11, may be a free layer, and the other, for example, the second magnetic layer M20, may be a pinned layer. The free layer indicates a magnetic layer whose magnetization direction may be changed, and the pinned layer indicates a magnetic layer whose magnetization direction is fixed (pinned). As the magnetization direction of the first magnetic layer M10 or M11 is changed while the magnetization direction of the second magnetic layer M20 is pinned, resistance between the first magnetic layer M10 or M11 and the second magnetic layer M20 may differ. Thus, the magnetic structure including the first magnetic layer M10 or M11, the second magnetic layer M20, and the non-magnetic layer N10 therebetween may be a magnetoresistive element. Particularly, when the non-magnetic layer N10 is an insulating layer, the magnetoresistive element may be a magnetic tunneling junction (MTJ) element. When the magnetization direction of the free layer (e.g., the first magnetic layer) is the same as the magnetization direction of the pinned layer (e.g., the second magnetic layer), the magnetoresistive element has a low value of resistance. When the magnetization direction of the free layer (e.g., the first magnetic layer) is opposite to the magnetization direction of the pinned layer (e.g., the second magnetic layer), the magnetoresistive element has a high value of resistance. The low value of resistance of the magnetoresistive element may correspond to data '0,' and the high value of resistance may correspond to data '1'.

FIGS. 9A through 9E are cross-sectional views showing a method of forming the magnetic structure (the magnetoresistive element) according to example embodiments. The method according to the present example embodiments involves forming the magnetic structure (the magnetoresistive element) of FIG. 6.

Figure 9A:
FIGS. 9A through 9E are cross-sectional views showing a method of forming a magnetic structure (a magnetoresistive element) according to example embodiments.

Referring to FIG. 9A, a stress-inducing layer S100 may be formed on a substrate (not shown). At this point, the stress-inducing layer S100 is not a layer inducing stress in another layer, but will become "a stress-inducing layer" later, and thus, is referred to as "a stress-inducing layer" for convenience. The stress-inducing layer S100 may be formed of a material with a thermal expansion coefficient greater than that of a magnetic layer (M100 of FIG. 9C) which will be formed later. For example, the stress-inducing layer S100 may be formed of at least one material selected from the group consisting of Al, Ga, Mn, Zn, Cu, etc. The stress-inducing layer S100 may be formed, for example, at room temperature or at a temperature similar to room temperature (a low temperature of about 150° C. or less).

Figure 9B:
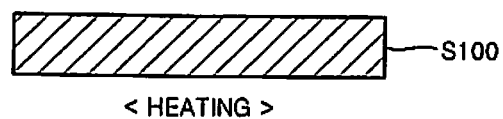

Referring to FIG. 9B, the stress-inducing layer S100 may be heated. For example, the stress-inducing layer S100 may be heated at a temperature of about 200 to 500° C. In this regard, the stress-inducing layer S100 may be expanded in the in-plane direction. When the stress-inducing layer is formed on a substrate (not shown), the stress-inducing layer S100 may be heated by heating the substrate.

Figure 9C:
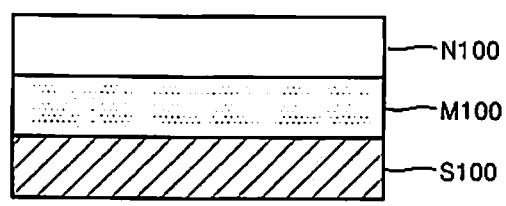

Referring to FIG. 9C, a first magnetic layer M100 and a non-magnetic layer N100 may be sequentially formed on the heated stress-inducing layer S100. The first magnetic layer M100 may have IPMA at an interface (i.e., a contact surface) with the non-magnetic layer N100. In other words, a stacking structure of the first magnetic layer M100 and the non-magnetic layer N100 may be an IPMA system or an IPMA structure. The first magnetic layer M100 may include a Fe-based or CoFe-based material, and the CoFe-based material may include, for example, CoFeB. The non-magnetic layer N100 may include an oxide, for example, a Mg oxide (i.e., MgO). Because the first magnetic layer M100 and the non-magnetic layer N100 are formed while the stress-inducing layer S100 is heated, the first magnetic layer M100 and the non-magnetic layer N100 may be also heated to the same (or to a similar) temperature as that of the stress-inducing layer S100.

Figure 9D:
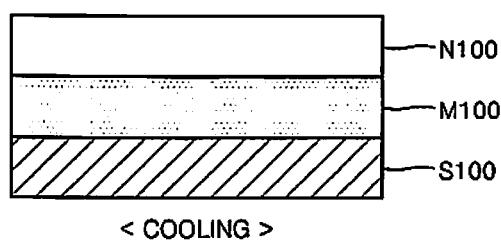

Referring to FIG. 9D, the heated stress-inducing layer S100, the first magnetic layer M100, and non-magnetic layer N100 may be cooled to a certain temperature. For example, the layers S100, M100, and N100 may be cooled to room temperature. Because the thermal expansion coefficient of the stress-inducing layer S100 is greater than that of the magnetic layer M100, a degree of contraction (shrinkage) of the stress-inducing layer S100 in the in-plane direction may be greater than that of the first magnetic layer M100. Therefore, a compressive stress may be induced in the first magnetic layer M100 in the in-plane direction due to the stress-inducing layer S100. Thus, the first magnetic layer M100 may have a lattice structure that is compressively strained due to the stress-inducing layer S100. Because a thickness of the first magnetic layer M100 is thin, the lattice structure may be compressively strained in all region of the first magnetic layer M100. That is, as well as the region of the first magnetic layer M10 which is in contact with the stress-inducing layer S100, the opposite region (i.e., the region of the first magnetic layer M100 which is in contact with the non-magnetic layer N100) may also be compressively strained. When the first magnetic layer M100 has a compressively strained structure, a magnetic anisotropy energy of the first magnetic layer M100 may increase.

Figure 9E:
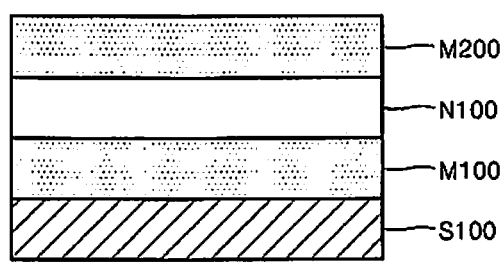

Referring to FIG. 9E, a second magnetic layer M200 may be formed on the non-magnetic layer N100. The second magnetic layer M200 may be formed of a ferromagnetic material including at least one of, for example, Co, Fe, and Ni. The ferromagnetic material may further include an element other than Co, Fe, and Ni, for example, B, Cr, Pt, or Pd. When the first magnetic layer M100 exhibits perpendicular magnetic anisotropy, the second magnetic layer M200 may also exhibit perpendicular magnetic anisotropy. One of the first magnetic layer M100 and the second magnetic layer M200, for example the first magnetic layer M100, may be a free layer, and the other, for example the second magnetic layer M200, may be a pinned layer. Such a magnetic structure of FIG. 9E may be a magnetoresistive element. When the non-magnetic layer N100 is an insulating layer, the magnetic structure of FIG. 9E may be a MTJ element.

Figure 10:
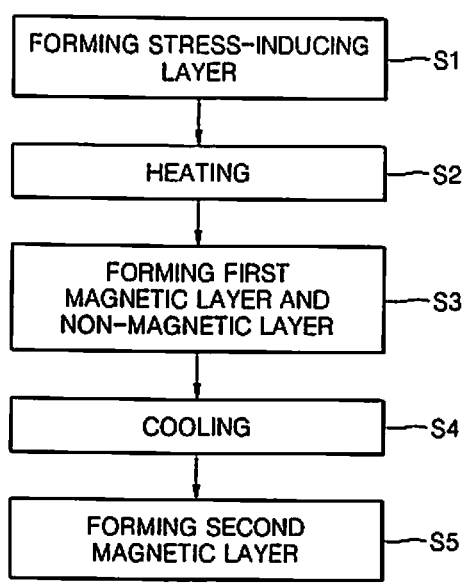
FIG. 10 is a flowchart summarizing a method of forming the magnetic structure of FIGS. 9A through 9E.

FIG. 10 is a flowchart summarizing the forming method described with reference to FIGS. 9A through 9E.

Referring to FIG. 10, a stress-inducing layer may be formed of a material with a high thermal expansion coefficient in a first step S1, the stress-inducing layer may be heated in a second step S2, and a stacked structure of a first magnetic layer and a non-magnetic layer may be formed thereon in a third step S3. Then, the stress-inducing layer and the stacked structure may be cooled in a fourth step S4, and a second magnetic layer may be formed thereon in a fifth step S5. The stacked structure of the first magnetic layer/the non-magnetic layer formed in the third step S3 may be an IPMA system. In the fourth step S4 (i.e., a cooling step), a compressive stress may be applied to the first magnetic layer as the stress-inducing layer is contracted (shrunk) in the in-plane direction. As a result, a lattice structure of the first magnetic layer may be compressively strained. The second magnetic layer may be formed at the third step S3 before the cooling stage (i.e., the fourth step S4). In other words, the cooling step S4 may be performed after forming the second magnetic layer on the non-magnetic layer.

When the stress-inducing layer is formed of a material with the high thermal expansion coefficient, if the stress-inducing layer is deposited at a high temperature, a surface morphology of the stress-inducing layer may possibly be degraded. Particularly, when the material with a high thermal expansion coefficient is a metal, if depositing it at a high temperature, the surface morphology of the stress-inducing layer may possibly be degraded. However, according to example embodiments described above, the stress-inducing layer is first formed at room temperature or a temperature similar to room temperature, heated at a later stage, the first magnetic layer and the non-magnetic layer are formed thereon, and then the layers are cooled. Thus, the above-mentioned problem, that is, degrading of the surface morphology of the stress-inducing layer may be prevented.

FIGS. 11A through 11D are cross-sectional views showing a method of forming a magnetic structure (a magnetoresistive element) according to example embodiments. The method according to the present example embodiments involves forming the magnetic structure (the magnetoresistive element) of FIG. 5.

Figure 11A:
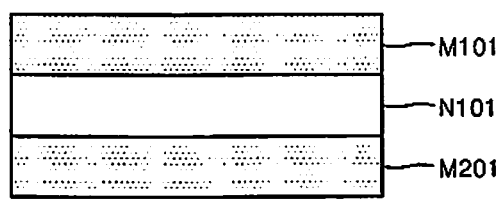
FIGS. 11A through 11D are cross-sectional views showing a method of forming a magnetic structure (a magnetoresistive element) according to example embodiments.

Referring to FIG. 11A, a second magnetic layer M201 may be formed. The second magnetic layer M201 may be formed of a ferromagnetic material including at least one of, for example, Co, Fe, Ni and combinations thereof. The ferromagnetic material may further include an element other than Co, Fe, Ni or combinations thereof. The second magnetic layer M201 may exhibit perpendicular magnetic anisotropy. A non-magnetic layer N101 and a first magnetic layer M101 may be sequentially stacked on the second magnetic layer M201. The first magnetic layer M101 may have IPMA at an interface (i.e. contact surface) with the non-magnetic layer N101. The first magnetic layer M101 may include a Fe-based material or a CoFe-based material, and the CoFe-based material may include, for example, CoFeB. The non-magnetic layer N101 may include an oxide, for example, a Mg oxide (i.e., MgO).

Figure 11B:
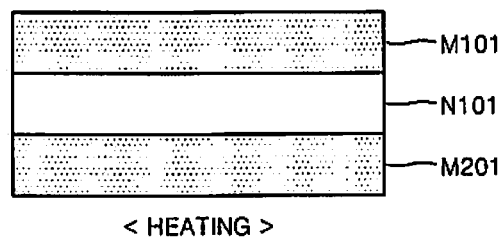

Referring to FIG. 11B, the first magnetic layer M101, the non-magnetic layer N101, and the second magnetic layer M201 may be heated. For example, the layers M101, N101, and M201 may be heated to a temperature of about 200 to 500° C. If the layers M101, N101, and M201 are formed on a substrate (not shown), the layers M101, N101, and M201 may be heated by heating the substrate.

Figure 11C:
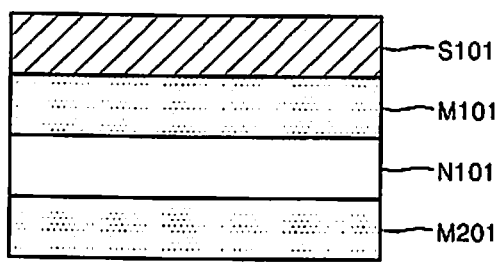

Referring to FIG. 11C, a stress-inducing layer S101 may be formed on the first magnetic layer M101 while the first magnetic layer M101, the non-magnetic layer N101, and the second magnetic layer M201 are heated. The stress-inducing layer S101 may be formed of a material with a thermal expansion coefficient greater than that of the first magnetic layer M101. For example, the stress-inducing layer S101 may be formed of at least one material selected from the group consisting of Al, Ga, Mn, Zn, Cu, etc. Because the stress-inducing layer S101 is formed at a high temperature, for example at about 200 to 500° C., the stress-inducing layer S101 may be formed in an expanded form in the in-plane direction.

Figure 11D:
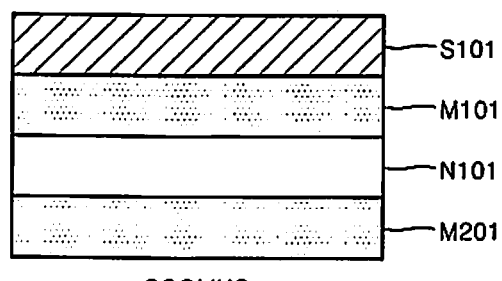

Referring to FIG. 11D, the stress-inducing layer S101, the first magnetic layer M101, the non-magnetic layer N101, and the second magnetic layer M201 may be cooled to a certain temperature. For example, the layers S101, M101, N101, and M201 may be cooled to room temperature. Because the thermal expansion coefficient of the stress-inducing layer S101 is greater than that of the first magnetic layer M101, a degree of contraction (shrinkage) of the stress-inducing layer S101 in the in-plane direction may be greater than that of the first magnetic layer M101. Therefore, a compressive stress may be applied to the first magnetic layer M101 in the in-plane direction due to the stress-inducing layer S101. Thus, the first magnetic layer M101 may have a lattice structure that is compressively strained due to the stress-inducing layer S101.

Figure 12:
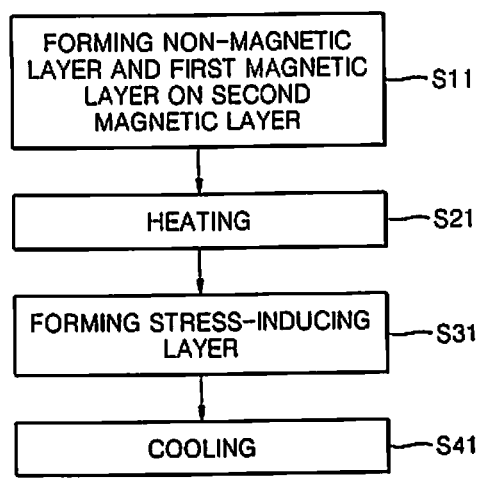
FIG. 12 is a flowchart summarizing a method of forming the magnetic structure of FIGS. 11A through 11D.

FIG. 12 is a flowchart summarizing the forming method described with reference to FIGS. 11A through 11D.

Referring to FIG. 12, a stacked structure of a non-magnetic layer and a first magnetic layer may be formed on a second magnetic layer in a first step S11, and the layers may be heating to a certain temperature of, for example, about 200 to 500° C. in a second step S21. Then, a stress-inducing layer may be formed of a material with a high thermal expansion coefficient on the heated first magnetic layer in a third step S31, the stress-inducing layer and the stacked structure may be cooled in a fourth step S41. In the fourth step S41 (i.e., a cooling step), a compressive stress may be applied to the first magnetic layer as the stress-inducing layer is contracted (shrunk) in the in-plane direction. As a result, a lattice structure of the first magnetic layer may be compressively strained.

FIGS. 13A through 13D are cross-sectional views showing a method of forming a magnetic structure (a magnetoresistive element) according to example embodiments. The method according to the present example embodiments involves forming the magnetic structure (the magnetoresistive element) of FIG. 6.

Figure 13A:
FIGS. 13A through 13D are cross-sectional views showing a method of forming a magnetic structure (a magnetoresistive element) according to example embodiments.
Figure 20A:
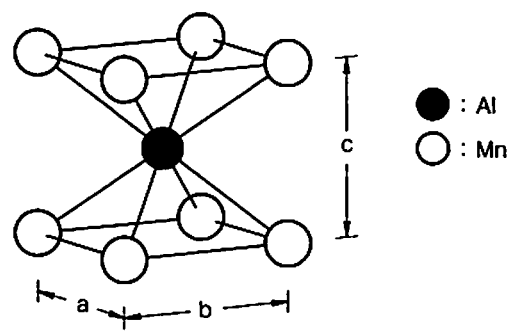
FIGS. 20A and 20B are drawings respectively showing a first phase ($\epsilon'$-phase) and a second phase ($\tau$-phase) of MnAl which may correspond to a stress-inducing layer material of a magnetic structure according to example embodiments.

Referring to FIG. 13A, a stress-inducing layer S102 may be formed on a substrate (not shown). At this stage, the stress-inducing layer S102 is not a layer inducing stress in another layer, but will become "a stress-inducing layer" later, and thus, is referred to as "a stress-inducing layer" for convenience. The stress-inducing layer S102 may be formed of a phase transformation material. The phase transformation material may be a material that has a first phase at low temperature and has a second phase at high temperature. A lattice parameter of the second phase in the in-plane direction may be smaller than that of the first phase. The phase transformation material may be a material which transforms to the second phase at high temperature and continuously maintains the second phase even when the temperature is decreased to a low temperature. That is, the phase transformation material may be a material that transforms its phase irreversibly. At this stage, the stress-inducing layer S102 may have the first phase. For example, the phase transformation material may include MnAl. Here, the MnAl may have $\epsilon'$-phase as illustrated in FIG. 20A. The $\epsilon'$-phase of FIG. 20A may correspond to the first phase.

Figure 13B:
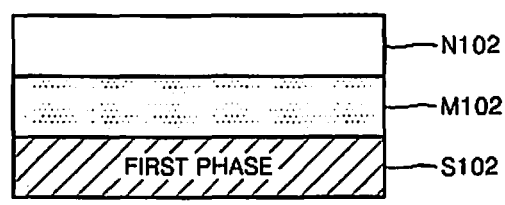

Referring to FIG. 13B, a first magnetic layer M102 and a non-magnetic layer N102 may be sequentially formed on the stress-inducing layer S102. The first magnetic layer M102 may have IPMA at an interface (i.e. contact surface) with the non-magnetic layer N102. In other words, the first magnetic layer M102 and the non-magnetic layer N102 may form an IPMA system or an IPMA structure. The first magnetic layer M102 may include a Fe-based or CoFe-based material, and the CoFe-based material may include, for example, CoFeB. The non-magnetic layer N102 may include an oxide, for example, a Mg oxide (i.e., MgO).

Figure 13C:
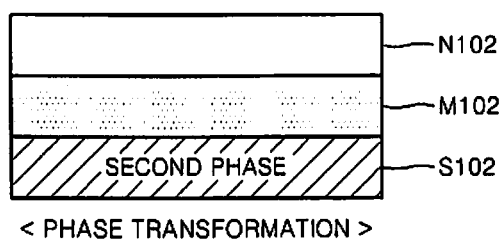

Referring to FIG. 13C, a phase of the stress-inducing layer S102 may be changed (transformed). A stage of changing (transforming) the phase of the stress-inducing layer S102 may include heating the stress-inducing layer S102 to a given temperature (e.g., about 300° C. or higher). As the phase of the stress-inducing layer S102 changes to a second phase, the lattice parameter of the stress-inducing layer S102 in the in-plane direction may be contracted. Thus, a compressive stress may be applied to the first magnetic layer M102 in the in-plane direction due to the stress-inducing layer S102. Therefore, the first magnetic layer M102 may have a lattice structure that is compressively strained due to the stress-inducing layer S102. Because a thickness of the first magnetic layer M102 is thin, the lattice structure may be compressively strained in an overall area of the first magnetic layer M102. When the first magnetic layer M102 has a compressively strained structure, a magnetic anisotropy energy of the first magnetic layer M102 may increase.

Figure 20B:
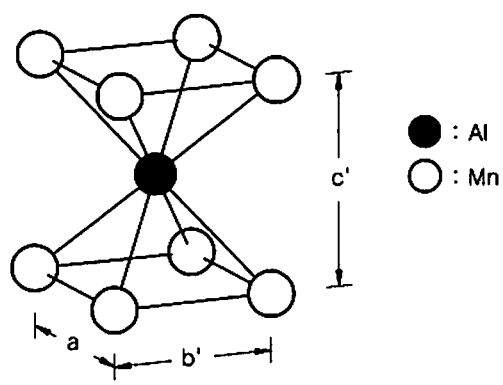

For example, when the stress-inducing layer S102 of FIG. 13C includes MnAl as a phase transformation material, the phase of MnAl may transform from ε'-phase of FIG. 20A to τ-phase of FIG. 20B. The τ-phase of FIG. 20B may correspond to the second phase. Parameter b' in τ-phase of FIG. 20B is smaller than parameter b in ε'-phase of FIG. 20A. That is, the lattice parameter in the in-plane direction is contracted due to the phase transformation.

Figure 13D:
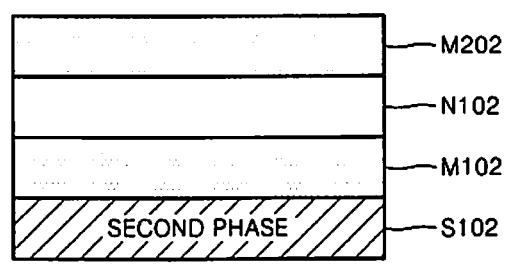

Referring to FIG. 13D, a second magnetic layer M202 may be formed on the non-magnetic layer N102. The second magnetic layer M202 may be formed of a ferromagnetic material including at least one of, for example, Co, Fe, Ni and combinations thereof. The ferromagnetic material may further include an element other than Co, Fe, Ni and combinations thereof. When the first magnetic layer M102 exhibits perpendicular magnetic anisotropy, the second magnetic layer M202 may also exhibits perpendicular magnetic anisotropy. One of the first magnetic layer M102 and the second magnetic layer M202, for example the first magnetic layer M102, may be a free layer, and the other, for example the second magnetic layer M202, may be a pinned layer. Such a magnetic structure of FIG. 13D may be a magnetoresistive element. When the non-magnetic layer N102 is an insulating layer, the magnetic structure of FIG. 13D may be a MTJ element.

Figure 14:
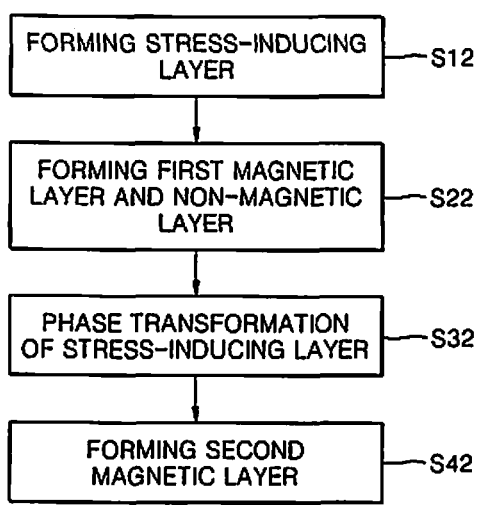
FIG. 14 is a flowchart summarizing a method of forming the magnetic structure of FIGS. 13A through 13D.

FIG. 14 is a flowchart summarizing the forming method described with reference to FIGS. 13A through 13D.

Referring to FIG. 14, a stress-inducing layer including a phase transformation material may be formed in a first step S12, a stacked structure of a first magnetic layer and a non-magnetic layer may be formed thereon in a second step S22. Next, a phase of the stress-inducing layer may be transformed in a third step S32, and a second magnetic layer may be formed on the non-magnetic layer in a fourth step S42. The stacked structure of the first magnetic layer and the non-magnetic layer formed in the second step S22 may be an IPMA system. In a third step S32 (i.e., a phase transforming step), compressive stress may be applied to the first magnetic layer as the stress-inducing layer contracts in the in-plane direction. As a result, a lattice structure of the first magnetic layer may be compressively strained. The second magnetic layer may be formed at the second step S22 before the phase transforming step (i.e., the third step) S32. In other words, the phase transforming step S32 may be performed after forming the second magnetic layer on the non-magnetic layer.

FIGS. 15A through 15D are cross-sectional views showing a method of forming a magnetic structure (a magnetoresistive element) according to example embodiments. The method according to example embodiments involves forming the magnetic structure (the magnetoresistive element) of FIG. 5.

Figure 15A:
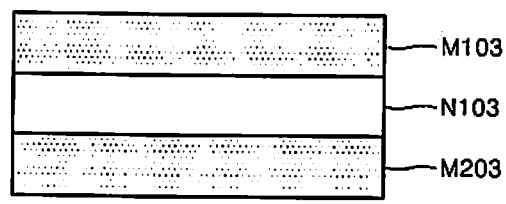
FIGS. 15A through 15C are cross-sectional views showing a method of forming a magnetic structure (a magnetoresistive element) according to example embodiments.

Referring to FIG. 15A, a second magnetic layer M203 may be formed. The second magnetic layer M203 may be formed of a ferromagnetic material including at least one of, for example, Co, Fe, Ni and combinations thereof. The ferromagnetic material may further include an element other than Co, Fe, Ni or combinations thereof. The second magnetic layer M203 may exhibit perpendicular magnetic anisotropy. Then, a non-magnetic layer N103 and a first magnetic layer M103 may be sequentially stacked on the second magnetic layer M203. The first magnetic layer M103 may have IPMA at an interface (i.e. contact surface) with the non-magnetic layer N103. The first magnetic layer M103 may include a Fe-based or CoFe-based material, and the CoFe-based material may include, for example, CoFeB. The non-magnetic layer N103 may include an oxide, for example, a Mg oxide (i.e., MgO).

Figure 15B:
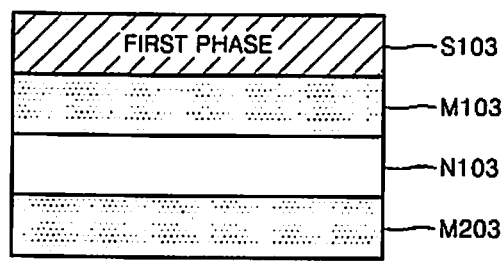

Referring to FIG. 15B, a stress-inducing layer S103 may be formed on the first magnetic layer M103. At this stage, the stress-inducing layer S103 is not a layer that induces stress in the first magnetic layer M103, but will become "a stress-inducing layer" later, and thus, is referred to as "a stress-inducing layer" for convenience. The stress-inducing layer S103 may be formed of a phase transformation material. The phase transformation material may be the same material as described above in relation to FIG. 13A.

Referring to 15C, a phase of the stress-inducing layer S103 may be changed (transformed). A method of changing (transforming) the phase of the stress-inducing layer S103 may be either identical or similar to the method of changing (transforming) the phase as described above in relation to FIG. 13C. As the phase of the stress-inducing layer S103 changes (transforms), the lattice parameter of the stress-inducing layer S103 in the in-plane direction may be contracted, and thus a compressive stress may be applied to the first magnetic layer M103 in the in-plane direction. Therefore, the first magnetic layer M103 may have a lattice structure that is compressively strained due to the stress-inducing layer S103.

Figure 15C:
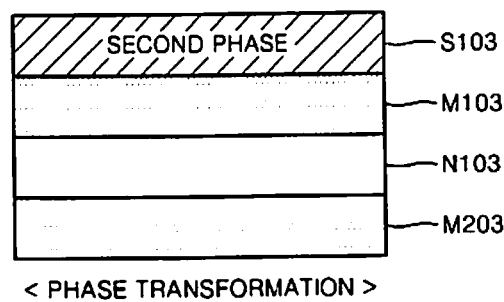
Figure 16:
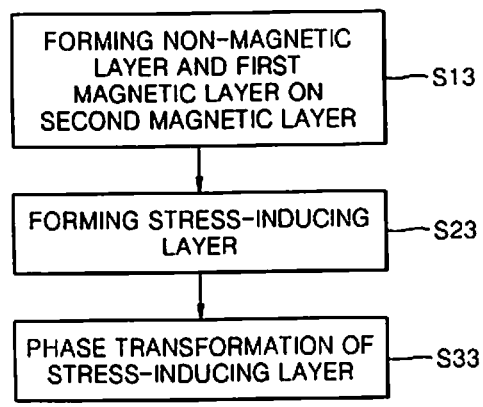
FIG. 16 is a flowchart summarizing a method of forming the magnetic structure of FIGS. 15A through 15C.

FIG. 16 is a flowchart summarizing the forming method described with reference to FIGS. 15A through 15C.

Referring to FIG. 16, a staked structure of a non-magnetic layer and a first magnetic layer may be formed on a second magnetic layer in a first step S13, a stress-inducing layer including a phase transformation material may be formed on the first magnetic layer in a second step S23, and a phase of the stress-inducing layer may be changed (transformed) in a third step S33. In the third step S33 (i.e., a phase transforming step), a compressive stress may be applied to the first magnetic layer as the stress-inducing layer contracts in the in-plane direction. As a result, a lattice structure of the first magnetic layer may be compressively strained.

According to example embodiments, in order to induce the compressive strain of a magnetic layer, a stress-inducing layer may be formed of a material with a lattice parameter smaller than that of the magnetic layer. The lattice parameter of the stress-inducing layer in the in-plane direction may be smaller than that of the magnetic layer. A difference between the lattice parameter of the stress-inducing layer and the lattice parameter of the magnetic layer may be within about 10%. If the material with the lattice parameter that is smaller than that of the magnetic layer is in contact with the magnetic layer, a compressive stress may be applied to the magnetic layer. Considering a situation of epitaxial growth, when the magnetic layer is epitaxially grown on a material layer with a relatively smaller lattice parameter, a compressive stress may be applied to the magnetic layer due to the material layer with the relatively smaller lattice parameter. By applying the material with the lattice parameter that is smaller than that of the magnetic layer as a material of the stress-inducing layer, a magnetic structure (a magnetoresistive element) as in FIG. 5 or FIG. 6 may be formed.

Also, according to example embodiments, the first magnetic layer M100, M101, M102, or M103 used in various manufacturing methods described above may be formed of a multi-layer structure. For example, the first magnetic layer M100, M101, M102, or M103 may be formed of a double-layer structure including the first layer (10 of FIG. 7 or FIG. 8) and the second layer (20 of FIG. 7 or FIG. 8). Here, the second layer may include a material with saturation magnetization (Ms) smaller than that of the first layer. As such, if the first magnetic layer M100, M101, M102, or M103 is, formed of a multi-layer structure, a magnetic structure (a magnetoresistive element) as in FIG. 7 or FIG. 8 may be manufactured. In addition, the manufacturing methods described above may be modified in various ways.

The magnetic structure (the magnetoresistive element) according to example embodiments may be used in various magnetic devices and electronic devices. For example, the magnetic structure (the magnetoresistive element) may be used in a memory cell of a memory device. As explained above, the magnetic structure (the magnetoresistive element) according to example embodiments may be easily scaled down and may have excellent performance and thermal stability, and thus if used in a memory device, a memory device of high density/high performance may be manufactured. The magnetoresistive element according to example embodiments may be used in many other devices as well as in the memory device.

Figure 17:
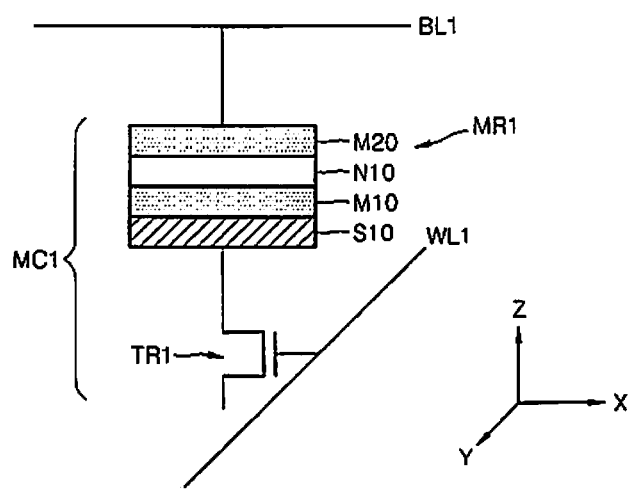
FIG. 17 is a drawing illustrating an example of a memory device including a magnetic structure (a magnetoresistive element) according to example embodiments.

FIG. 17 is a view showing an example of a memory device including a magnetic structure (a magnetoresistive element) according to example embodiments.

Referring to FIG. 17, the memory device according to the present example embodiments may include a magnetoresistive element MR1 and a switching element TR1 connected thereto in a memory cell MC1. The magnetoresistive element MR1 may include one of the various structures described in FIGS. 5 through 8, for example, the structure of FIG. 6. One of a first magnetic layer M10 and a second magnetic layer M20 of the magnetoresistive element MR1, for example the first magnetic layer M10, may be a free layer, and the other, for example the second magnetic layer M20, may be a pinned layer. The switching element TR1 may be, for example, a transistor. The switching element TR1 may be electrically connected to the first magnetic layer M10 of the magnetoresistive element MR1.

The memory cell MC1 may be connected between a bit-line BL1 and a word-line WL1. The bit-line BL1 and the word-line WL1 may be formed to intersect each other, and the memory cell MC1 may be formed at the point of intersection. The bit-line BL1 may be connected to the magnetoresistive element MR1. The second magnetic layer M20 of the magnetoresistive element MR1 may be electrically connected to the bit-line BL1. The word-line WL1 may be connected to the switching element TR1. When the switching element TR1 is a transistor, the word-line WL1 may be connected to a gate electrode of the switching element TR1. A write current, a read current, an erase current, etc. may be applied to the memory cell MC1 via the word-line WL1 and the bit-line BL1.

Although one memory cell MC1 is shown in FIG. 17, a plurality of the memory cells MC1 may be arranged to form an array. That is, a plurality of the bit-lines BL1 and a plurality of the word-lines WL1 may be arranged intersecting each other, and the memory cell MC1 may be disposed at each point of intersection.

The memory device of FIG. 17 may be a magnetic random access memory (MRAM). Here, the memory device of FIG. 17 may be a device that writes data by using a spin transfer torque. The spin transfer torque may be induced by a current. As a spin torque induced by the current is transferred to the free layer, for example the first magnetic layer M10, the first magnetic layer M10 may be magnetized in a given direction. According, to a direction of the current, a magnetization direction of the first magnetic layer M10 may differ. The memory device that writes data by using the spin transfer torque may be referred to as a spin transfer torque MRAM (STT-MRAM). In a case of STT-MRAM, an additional wire (i.e., a digit line) to generate an external magnetic field is not necessary unlike a conventional MRAM, and thus the STT-MRAM may be highly integrated and may be simply operated.

While aspects have been particularly shown and described with reference to differing elements thereof, it should be understood that the example embodiments described herein should be considered in a descriptive sense only and not for purposes of limitation. For example, it may be obvious to one of ordinary skill in the art to which example embodiments are related that the magnetic structures (the magnetoresistive elements) of FIGS. 1 through 8 may be modified in various ways. As a concrete example, a second stress-inducing layer in contact with the second magnetic layer M20 may be further included in the magnetic structures (the magnetoresistive elements) of FIGS. 5 through 8, and here, the second magnetic layer M20 may also have a lattice structure that is compressively strained. Also, the magnetic structures (the magnetoresistive elements) according to example embodiments may be used in memory devices of other structure as well as the memory device of FIG. 17 or in other magnetic devices (e.g., a magnetic sensor etc.) rather than the memory devices. In addition, the methods of forming the magnetic structures (the magnetoresistive elements) described in reference to FIGS. 9A through 16 may be changed in various ways. Therefore, the scope is defined not by the detailed description but by the appended claims.

What is claimed is:

1. A method of forming a magnetic structure, the method comprising:
    forming a magnetic layer having a lattice structure compressively strained due to a stress-inducing layer; and
    forming a non-magnetic layer contacting the magnetic layer,
    wherein forming the magnetic layer includes,
        forming the stress-inducing layer and a magnetic material layer in contact with the stress-inducing layer, and
        irreversibly changing a phase of the stress-inducing layer by applying heat to the stress-inducing layer such that the stress-inducing layer maintains a phase associated with the applied heat in the absence of the applied heat and the lattice structure of the magnetic material layer is compressively strained.

2. The method of claim 1, wherein the magnetic layer has interface perpendicular magnetic anisotropy (IPMA) due to an interface between the magnetic layer and the non-magnetic layer.

3. The method of claim 1, wherein the stress-inducing layer is formed of a material with a thermal expansion coefficient higher than a thermal expansion coefficient of the magnetic layer.

4. The method of claim 3, wherein forming the magnetic layer further includes,
    heating the stress-inducing layer;
    forming the magnetic material layer on the heated stress-inducing layer; and
    cooling the magnetic material layer and the stress-inducing layer such that the lattice structure of the magnetic material layer is compressively strained and the magnetic layer is formed.

5. The method of claim 3, wherein forming the magnetic layer further includes,
    forming the magnetic material layer;
    heating the magnetic material layer;

forming the stress-inducing layer on the heated magnetic material layer; and cooling the stress-inducing layer and the magnetic material layer such that the lattice structure of the magnetic material layer is compressively strained and the magnetic layer is formed.

6. The method of claim 1, wherein the stress-inducing layer is formed of a material with a lattice parameter smaller than a lattice parameter of the magnetic layer.

7. The method of claim 1, wherein
the magnetic layer includes,
a first layer in contact with the non-magnetic layer; and
a second layer disposed between the first layer and the stress-inducing layer, and
wherein a saturation magnetization (Ms) of the second layer is smaller than a saturation magnetization of the first layer.

8. The method of claim 1, wherein the magnetic layer is a first magnetic layer,
the method further comprises forming a second magnetic layer on a surface of the non-magnetic layer, and
the non-magnetic layer is disposed between the first and second magnetic layer.

9. The method of claim 8, wherein one of the first and second magnetic layers is a free layer, and the other is a pinned layer.

10. The method of claim 1, wherein the irreversibly changing the phase of the stress-inducing layer by applying heat to the stress-inducing layer includes heating the stress-inducing layer to a temperature that is greater than about 300° C.

11. A memory device, comprising:
at least one memory cell including a magnetoresistive element, wherein the magnetoresistive element includes;
first and second magnetic layers spaced apart from each other;
a non-magnetic layer between the first and second magnetic layers; and
a stress-inducing layer configured to induce a compressive stress in the first magnetic layer,
wherein the first magnetic layer has a lattice structure compressively strained due to the stress-inducing layer, and
the stress-inducing layer has undergone an irreversible phase change due to the application of heat to the stress-inducing layer, such that the stress-inducing layer is configured to maintain a phase associated with the application of heat in the absence of the application of heat.

12. The memory device of claim 11, wherein the memory cell further includes a switching element connected to the magnetoresistive element.

13. The memory device of claim 11, wherein the first magnetic layer is a free layer, and the second magnetic layer is a pinned layer.

14. The memory device of claim 11, wherein the first magnetic layer has interface perpendicular magnetic anisotropy (IPMA) due to an interface between the first magnetic layer and the non-magnetic layer.

15. The memory device of claim 11, wherein the stress-inducing layer includes a material with a thermal expansion coefficient higher than a thermal expansion coefficient of the first magnetic layer.

16. The memory device of claim 11, wherein the stress-inducing layer includes a material with a lattice parameter smaller than a lattice parameter of the first magnetic layer.

17. The memory device of claim 11, wherein the first magnetic layer includes,
a first layer in contact with the non-magnetic layer; and
a second layer disposed between the first layer and the stress-inducing layer,
wherein a saturation magnetization (Ms) of the second layer is smaller than a saturation magnetization of the first layer.

18. The memory device of claim 11, wherein the memory device is a spin transfer torque magnetic random access memory (STT-MRAM).

19. The memory device of claim 11, wherein the stress-inducing layer includes τ-phase MnAl.

* * * * *